United States Patent [19]

Nomura et al.

[11] Patent Number: 5,489,337
[45] Date of Patent: Feb. 6, 1996

[54] APPARATUS FOR APPLYING ORGANIC MATERIAL TO SEMICONDUCTOR WAFER IN WHICH THE NOZZLE OPENING ADJUSTS IN RESPONSE TO DATA

[75] Inventors: Wataru Nomura, Ichikawa; Hiroshi Haraguchi, Tokyo; Masahiro Abe, Yokohama, all of Japan

[73] Assignee: Kabushiki Kaisha Toshiba, Kawasaki, Japan

[21] Appl. No.: 186,275

[22] Filed: Jan. 25, 1994

[30] Foreign Application Priority Data

Jan. 28, 1993 [JP] Japan ................... 5-012731
Feb. 25, 1993 [JP] Japan ................... 5-036527

[51] Int. Cl.$^6$ ..................... B05C 11/00; B05C 5/00
[52] U.S. Cl. ............... 118/677; 118/676; 118/712; 118/720; 118/301; 118/323; 118/504; 239/97; 239/586
[58] Field of Search .................. 118/668, 673, 118/674, 677, 678, 712, 720, 721, 301, 323, 504, 63, 676, 505; 239/97, 103, 586, 104, 150, 288; 437/225, 948, 7, 8

[56] References Cited

U.S. PATENT DOCUMENTS

| | | | |
|---|---|---|---|
| 4,041,895 | 8/1977 | Overton et al. | 118/63 |
| 4,206,876 | 6/1980 | Koch | 239/455 |
| 4,417,540 | 11/1983 | Wohlfeil | 118/63 |
| 4,431,690 | 2/1984 | Matt et al. | 118/674 |
| 4,666,732 | 5/1987 | Schucker | 118/712 |
| 4,667,879 | 5/1987 | Muller | 118/411 |
| 4,762,578 | 8/1988 | Burgin, Jr. et al. | 118/712 |
| 4,932,358 | 6/1990 | Studley et al. | 118/712 |
| 5,127,362 | 7/1992 | Iwatsu et al. | 118/712 |
| 5,134,962 | 8/1992 | Amada et al. | 118/712 |
| 5,328,722 | 7/1994 | Ghanayem et al. | 118/712 |

FOREIGN PATENT DOCUMENTS

| | | | |
|---|---|---|---|
| 4-363167 | 12/1992 | Japan | 118/712 |
| 5-136040 | 6/1993 | Japan | 118/320 |

*Primary Examiner*—David L. Lacey
*Assistant Examiner*—Steven P. Griffin
*Attorney, Agent, or Firm*—Finnegan, Henderson, Farabow, Garrett & Dunner

[57] ABSTRACT

An organic material applying apparatus of the present invention includes a movable organic material discharge nozzle having an organic material discharge port for discharging an organic material at a position facing a semiconductor wafer. The opening width of the discharge port is adjustable. A movement time of the nozzle measured from a predetermined position of the semiconductor wafer at a predetermined velocity of relative movements of the nozzle and semiconductor wafer is detected by a movement time detecting device. A width of that portion of the semiconductor wafer, which the discharge port of the moved nozzle faces, is calculated by a wafer width calculating device on the basis of the movement time of the nozzle detected by the movement time detecting device. The opening width of the discharge port of the nozzle is adjusted by a nozzle discharge port opening width adjusting device in accordance with the wafer width calculated by the wafer width calculating device. Thereby, the amount of wasted organic material discharged from the nozzle is reduced.

16 Claims, 6 Drawing Sheets

APPARATUS FOR APPLYING ORGANIC MATERIAL TO SEMICONDUCTOR WAFER IN WHICH THE NOZZLE OPENING ADJUSTS IN RESPONSE TO DATA

BACKGROUND OF THE INVENTION

1. Field of the Invention

The present invention relates to an organic material applying apparatus for applying an organic material onto an upper surface of a semiconductor wafer in a manufacturing process of a semiconductor device, and more particularly to an organic material applying apparatus for applying an organic material onto a semiconductor wafer wherein the amount of that portion of the organic material, which is not retained on the surface of the wafer and wasted, is reduced and thereby the organic material is used efficiently.

2. Description of the Related Art

The performance and integration density of state-of-the-art semiconductor devices are enhanced, and very precise alignment, as well as miniaturization and uniformity, is required for lithographic technology used in the manufacturing process of the semiconductor devices. A spin-coating method has conventionally been adopted in an organic material applying apparatus for applying an organic material such as photoresist material, which is essential to lithographic technology, to the upper surface of a semiconductor wafer.

Figure 1:
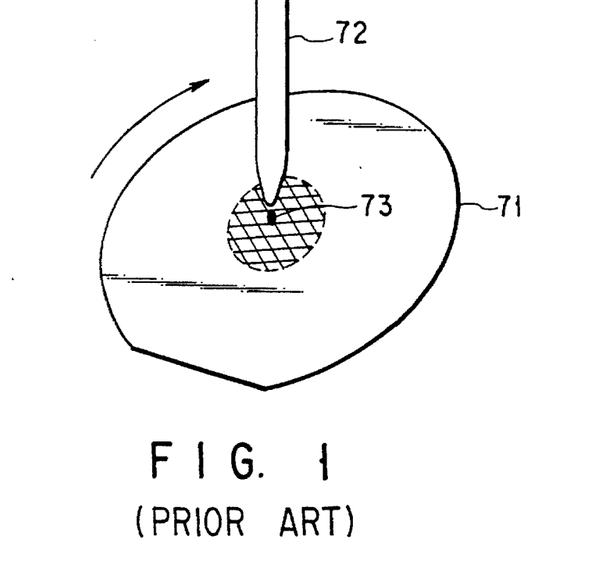
FIG. 1 is a view showing schematically a part of portion of a resist applying apparatus in order to explain a resist applying method according conventional spin-coating.

FIG. 1 is a view for generally illustrating a conventional resist applying method according to spin-coating.

Specifically, a drop of photoresist material 73 is fallen from a nozzle 72 onto a semiconductor wafer 71 and then the wafer 71 is rotated. Thereby, the photoresist material 73 is spread over the semiconductor wafer 71, and it is coated on the wafer 71.

However, according to the spin-coating resist applying method, the ratio of the resist material remaining on the wafer to the entire resist material discharged from the nozzle is several %, and more than 90% of the discharged material is wasted during spreading and coating. Thus, the photoresist material is considerably wasted.

On the other hand, in order to efficiently use the resist material, a blade dispense nozzle method has been proposed. According to this method, the wafer need not be rotated, and more than 90% of the entire resist material discharged from the nozzle can be left on the wafer, while the resist material wasted is reduced to 10% or less.

Figure 2:
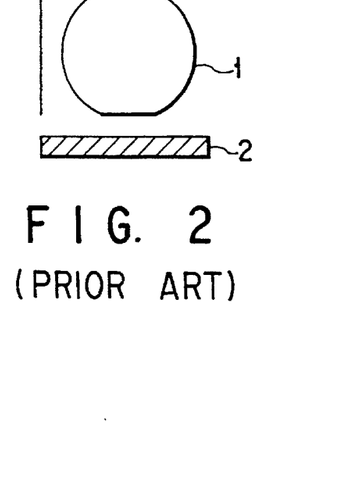
FIG. 2 is a view showing schematically the structure of a photoresist applying apparatus using a conventional blade dispense method.

FIG. 2 is a plan view showing schematically the structure of an important portion of a photoresist applying apparatus according to a conventional blade dispense method.

Specifically, while a dispense nozzle 2 is moved in the direction of arrow A over the upper surface of a stationary semiconductor wafer 1, a photoresist material is jetted from a distal end portion of the nozzle 2 and coated on the surface of the wafer 1. In this case, the velocity of movement of the wafer 1 and the rate of discharge of the photoresist material are controlled, thereby controlling the thickness of a photoresist film formed on the semiconductor wafer 1.

However, in the actual wafer processing, the rate of discharge of photoresist material is constant, although the width of the portion of the wafer, which the dispense nozzle 2 faces successively, varies while the photoresist film is coated on the semiconductor wafer 1 by the photoresist applying apparatus shown in FIG. 2. Thus, when the dispense nozzle 2 faces a narrow portion of the wafer 1, the resist material, the amount of which is greater than necessary, is discharged on the wafer 1 and a considerable amount of resist material is lost.

In addition, when a photoresist film is coated on the semiconductor wafer 1 by the photoresist applying apparatus shown in FIG. 2, the photoresist film adheres to the peripheral portion of the wafer 1, too. Consequently, it is necessary to provide a step for removing the unnecessary photoresist film on the peripheral portion of the wafer after the coating of the photoresist. Dust occurring in this step may result in occurrence of particles while the wafer is moved in subsequent steps (e.g. pattern etching).

SUMMARY OF THE INVENTION

The object of the present invention is to solve the above problems and to provide an organic material applying apparatus for applying an organic material to a semiconductor wafer, wherein the amount of discharged organic material can be controlled in accordance with the width of the semiconductor wafer and the organic material onto a wafer peripheral portion is not discharged to prevent an unnecessary resist film from being formed on the wafer peripheral portion, thereby reducing the amount of used organic material and reducing the amount of lost material.

In order to achieve the above object, there is provided an organic material applying apparatus comprising:

a movable organic material discharge nozzle having an organic material discharge port for discharging an organic material at a position facing a semiconductor wafer, the opening width of the discharge port being adjustable;

movement time detecting means for detecting a movement time of the nozzle measured from a predetermined position of the semiconductor wafer at a predetermined velocity of relative movements of the nozzle and the semiconductor wafer;

wafer width calculating means for calculating a width of that portion of the semiconductor wafer, which the discharge port of the moved nozzle faces, on the basis of the movement time detected by the movement time detecting means; and nozzle discharge port opening width adjusting means for adjusting the opening width of the discharge port of the nozzle in accordance with the wafer width calculated by the wafer width calculating means.

There is also provided an organic material applying apparatus comprising:

a movable organic material discharge nozzle having an organic material discharge port for discharging an organic material at a position facing a semiconductor wafer, the opening width of the discharge port being adjustable;

sensing means, provided near an end portion of the nozzle, for sensing the position of an edge of the semiconductor wafer; and nozzle discharge port opening width adjusting means for adjusting the opening width of the discharge port of the nozzle in accordance with the position of the edge of the semiconductor wafer sensed by the sensing means.

There is also provided an organic material applying apparatus comprising:

a movable organic material discharge nozzle having an organic material discharge port for discharging an organic material at a position facing a semiconductor wafer, the opening width of the discharge port being adjustable;

movement time detecting means for detecting a movement time of the nozzle measured from a predetermined position of the semiconductor wafer at a predetermined velocity of relative movements of the nozzle and the semiconductor wafer;

wafer width calculating means for calculating a width of that portion of the semiconductor wafer, which the discharge port of the moved nozzle faces, on the basis of the movement time detected by the movement time detecting means;

nozzle discharge port opening width adjusting means for adjusting the opening width of the discharge port of the nozzle in accordance with the wafer width calculated by the wafer width calculating means; and a mask member, interposed between the nozzle and the semiconductor wafer, for masking a peripheral portion of the wafer and preventing discharge of the organic material from the nozzle.

Furthermore, there is provided an organic material 1 applying apparatus comprising:

a movable organic material discharge nozzle having an organic material discharge port for discharging an organic material at a position facing a semiconductor wafer, the opening width of the discharge port being adjustable;

sensing means, provided near an end portion of the nozzle, for sensing the position of an edge of the semiconductor wafer;

nozzle discharge port opening width adjusting means for adjusting the opening width of the discharge port of the nozzle in accordance with the position of the edge of the semiconductor wafer sensed by the sensing means; and a mask member, interposed between the nozzle and the semiconductor wafer, for masking a peripheral portion of the wafer and preventing discharge of the organic material from the nozzle.

According to the organic material applying apparatus of the present invention, the amount of discharged organic material can be controlled in accordance with the width of the semiconductor wafer and the organic material onto a wafer peripheral portion is not discharged to prevent an unnecessary resist film from being formed on the wafer peripheral portion, thereby reducing the amount of used organic material and reducing the amount of lost material.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Preferred embodiments of the present invention will now be described in detail with reference to the accompanying drawings.

Figure 3:
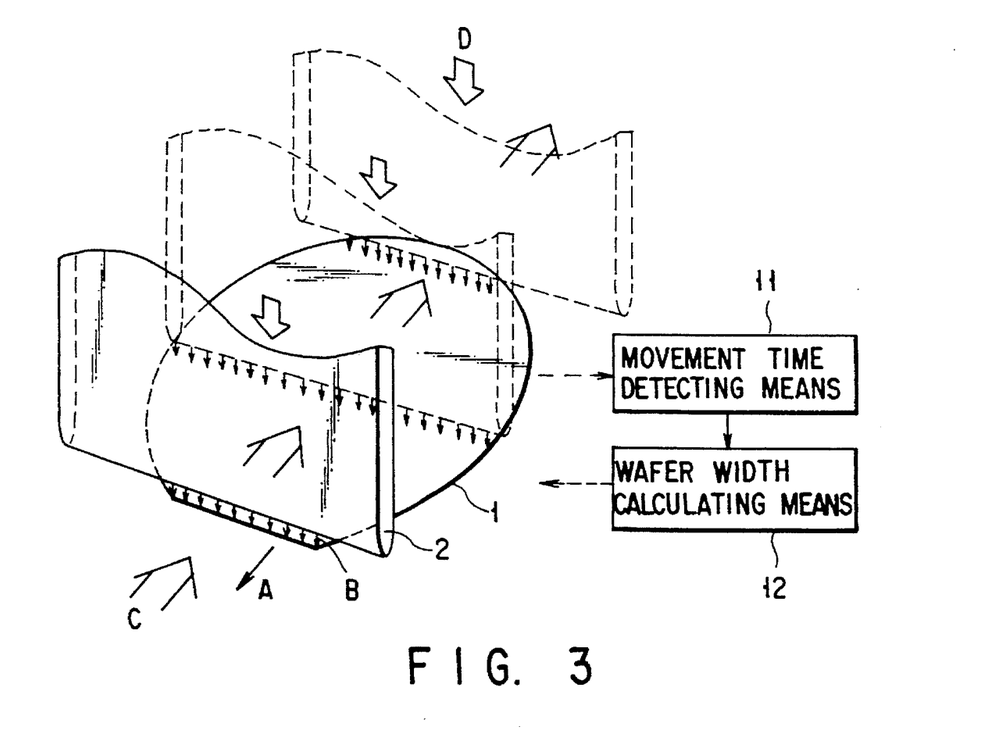
FIG. 3 shows schematically the structure of a part of portion of an organic material applying apparatus according to an embodiment of the present invention.

FIG. 3 shows schematically the structure of an important portion of an organic material applying apparatus according to an embodiment of the present invention, i.e. a photoresist applying apparatus adopting a blade dispense method (or a slit dispense method).

With this photoresist applying apparatus, a photoresist material is jetted in a vapor phase in the direction of arrow B from an end portion of a dispense nozzle (a blade nozzle or a slit nozzle) 2 onto the upper surface of a semiconductor wafer 1 which is moved in the direction of arrow A by a wafer moving apparatus (not shown).

The end portion of the dispense nozzle is moved in the direction of arrow C (opposite to direction A of movement of the semiconductor wafer). The photoresist material is fed within the dispense nozzle 2 in the direction of arrow D.

The thickness of a photoresist film to be formed on the semiconductor wafer 1 can be controlled by controlling the velocity of relative movements of the wafer 1 and nozzle 2 and the discharge rate of the photoresist material.

Either the semiconductor wafer 1 or nozzle 2 may be stationary.

In addition, this apparatus includes movement time detecting means 11 for detecting a movement time of the nozzle measured from a predetermined position of the semiconductor wafer at a predetermined velocity of relative movements of the nozzle and the semiconductor wafer, wafer width calculating means 12 for calculating a width of that portion of the semiconductor wafer, which a discharge port of the moved nozzle faces, on the basis of the movement time detected by the movement time detecting means 11, and nozzle discharge port opening width adjusting means (not shown in FIG. 3) for adjusting the opening width of the discharge port of the nozzle in accordance with the wafer width calculated by the wafer width calculating means 12.

Figure 4A:
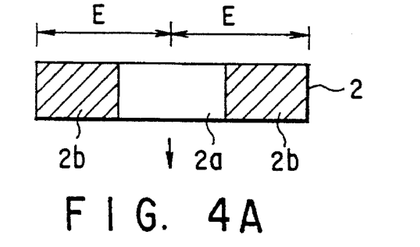
FIGS. 4A to 4C are cross-sectional views illustrating adjustment of an opening width of an organic agent discharge port of a nozzle shown in FIG. 3.
Figure 4B:
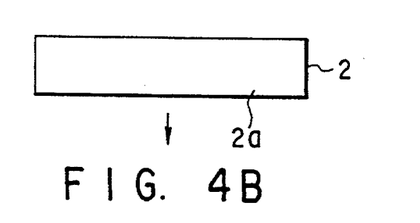
Figure 4C:
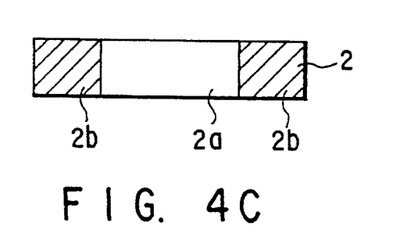

FIGS. 4A to 4C show a distal end portion of the nozzle discharge port 2a, for illustrating adjustment of the opening width of the discharge port 2a of the nozzle 2 according to the wafer width of that portion of the wafer which faces the nozzle 2 in the apparatus shown in FIG. 3.

According to the nozzle discharge port opening adjusting means, for example, a discharge port shielding member 2b at the nozzle tip is moved in the direction of double-headed arrow E, as indicated by hatched portions in FIG. 4, thereby adjusting the width of the opening 2a.

According to the photoresist applying apparatus of the above first embodiment, the movement time of the nozzle measured from a predetermined position of the semiconductor wafer (e.g. an orientation flat portion) at a predetermined velocity of relative movements of the nozzle and semiconductor wafer is detected. On the basis of the detected movement time, the wafer width of that portion of the wafer which faces the nozzle 2 is automatically calculated, and the opening width of the nozzle discharge port 2a in the wafer width direction is adjusted according to the output representing the result of the calculation.

Thus, the amount of the photoresist material to be discharged from the nozzle 2 onto even a narrow width of the portion of the wafer is controlled according to the adjusted opening width, and the use of excess photoresist material is prevented.

Figure 5:
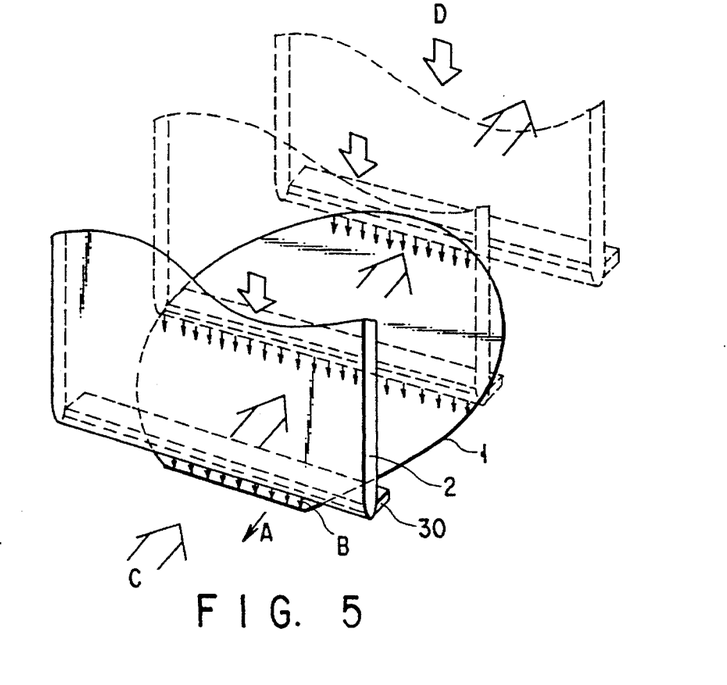
FIG. 5 shows schematically the structure of an important portion of an organic material applying apparatus according to another embodiment of the invention.

FIG. 5 shows schematically the structure of an important portion of a blade dispense type photoresist applying apparatus according to a second embodiment of the invention.

This apparatus includes a sensor (e.g. a photoelectric conversion sensor) 30, provided near the discharge port of the nozzle, for sensing an edge of the wafer, in place of the movement time detecting means 11 and wafer width calculating means 12 of the photoresist applying apparatus of the first embodiment. The sensor 30 moves along with the nozzle 2. When the sensor 30 senses the edge of the wafer 1, the width of the edge can be found on the basis of an output of the sensor 30 obtained at that time. The same advantage as in the first embodiment shown in FIG. 1 can be obtained by adjusting the discharge port opening width by the nozzle discharge port opening width adjusting means on the basis of the sensed edge width.

Figure 6A:
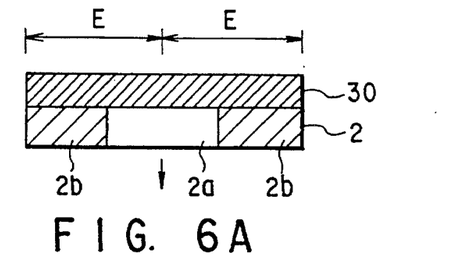
FIGS. 6A to 6C are cross-sectional views illustrating adjustment of an opening width of an organic agent discharge port of a nozzle shown in FIG. 5.
Figure 6B:
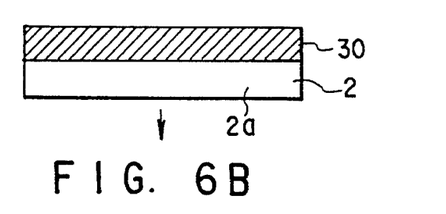
Figure 6C:
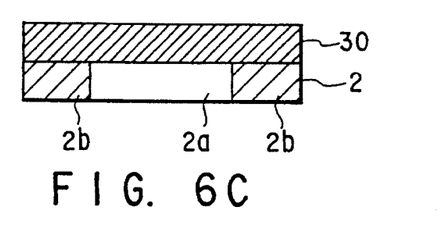

FIGS. 6A to 6C are cross-sectional views showing the discharge port 2a of the nozzle 2, illustrating the adjustment of the opening width of the discharge port 2a in the wafer width direction in accordance with the wafer width, in the apparatus shown in FIG. 5 in which the sensor 30 for sensing the edge of the wafer 1 is attached near the discharge port 2a of nozzle 2. The opening width 2a can be adjusted by moving a discharge port shielding member 2b in the direction of arrow E.

Figure 7:
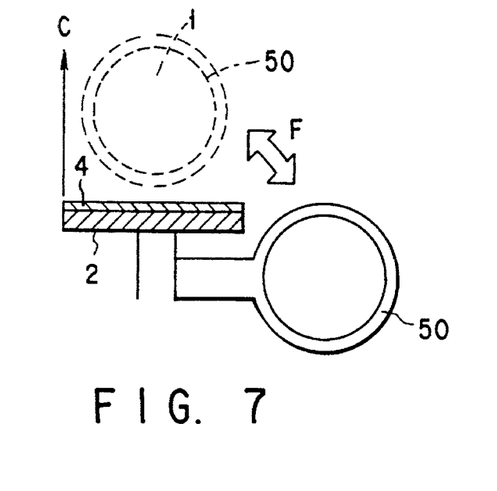
FIGS. 7 and 8 illustrate the operation of a mask member, situated between a nozzle and a semiconductor wafer, for masking a peripheral portion of the wafer and preventing discharge of organic material from the nozzle.
Figure 8:
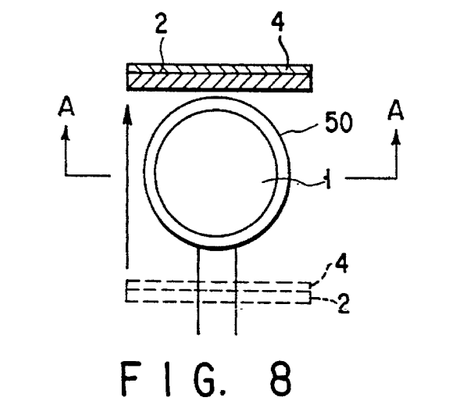

FIGS. 7 and 8 illustrate the general operation of a mask member 50, situated between the nozzle 2 and semiconductor wafer 1, for masking a peripheral portion of the wafer and preventing discharge of organic material from the nozzle 2 in the blade dispense type photoresist applying apparatus.

In this photoresist applying apparatus, while the discharge type nozzle 2 moves in direction C crossing the stationary semiconductor wafer 1, it discharges photoresist material in a vapor phase onto the upper surface of the wafer 1. The thickness of a photoresist film to be formed on the semiconductor wafer 1 can be controlled by controlling the velocity of movement of the nozzle 2 and the discharge rate of the photoresist material.

Figure 9:
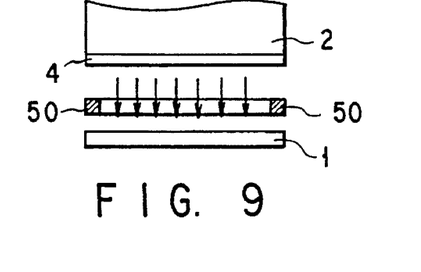
FIG. 9 is a cross-sectional view taken along line A—A in FIG. 8.
Figure 10:
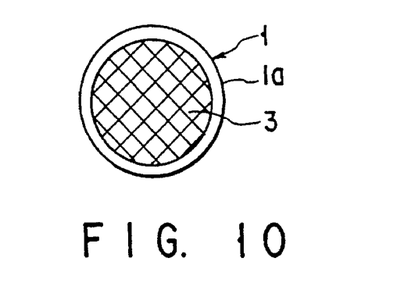
FIG. 10 shows the state in which a photoresist is not formed on the peripheral portion of the wafer by virtue of the mask member shown in FIGS. 7 and 8.

In FIG. 7, the position of the ring-shaped mask member 50, at the time the nozzle 2 is not above the wafer 1 and the photoresist material is not discharged from the nozzle 2, is indicated by solid lines. An optical sensor 4 is provided near the organic material discharge port of the nozzle 2. The mask member 50 is reciprocally rotatable in the direction of double-headed arrow F. As is shown in FIG. 8, when the nozzle 2 is moved in direction C and the photoresist material is discharged from the nozzle 2 onto the wafer 1, the ring-shaped mask member 50 is rotated to mask a peripheral portion 1a of the wafer 1. Therefore, as shown in FIG. 9, the optical sensor 4 emits light and senses light reflected from the wafer 1. A well guide ring 50 is made of a material with low light reflectance. As is shown in FIG. 9, the nozzle situated above the wafer surface discharges a resist material since the optical sensor senses reflected light from the wafer. However, if the nozzle is situated above the guide ring 50, it does not discharge the resist material since the optical sensor does not sense reflected light from the guide ring 50. Accordingly, as shown in FIG. 10, the photoresist material 3 is applied to only the resist surface excluding the peripheral portion 1a of the wafer 1.

In the resist coating methods for coating plural resist layers, as shown in FIGS. 11 to 14, the resist material can be reduced on the basis of the same principle.

Figure 11:
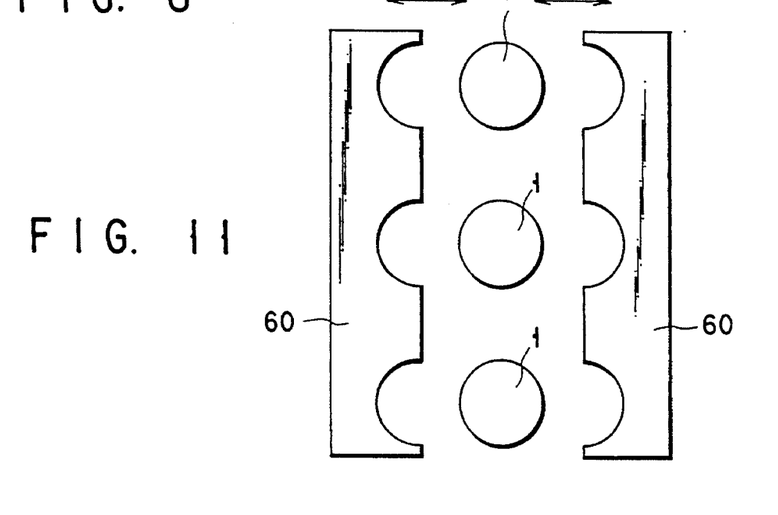
FIGS. 11 and 12 illustrate the operation of mask member for masking a peripheral portion of the wafer according to another embodiment of the invention.

FIG. 11 shows another example of an apparatus designed to mask a wafer peripheral portion. This apparatus is provided with guides 60 which can be reciprocally moved in the direction of double-headed arrow G so that they may move towards each other to cover the peripheral portions of stationary wafers 1 or may move away from each other.

Figure 12:
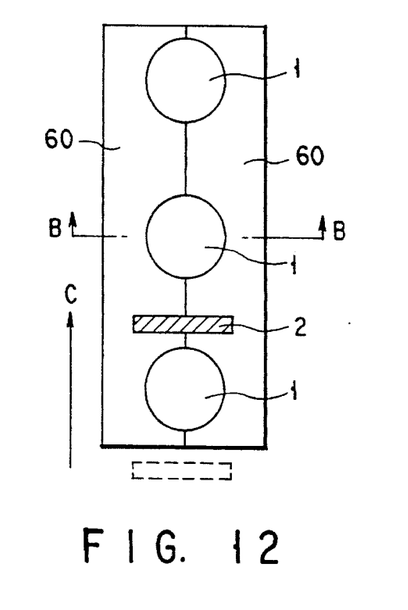
Figure 13:
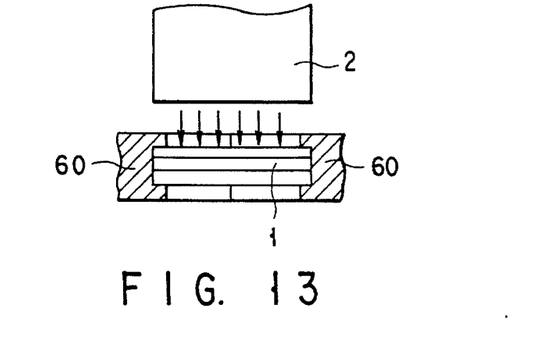
FIG. 13 is a cross-sectional view taken along line B—B in FIG. 12.

In FIG. 12, the guides 60 are moved into contact with each other to clamp the wafers 1 from both sides, so that the peripheral portions 1a of the wafer 1 may be masked by the guide 60, at the time the nozzle 2 moves over the wafers 1 in the direction of arrow C while discharging the photoresist material. In this case, the photoresist material discharged from the nozzle 2 is blocked at the peripheral portions of the wafers 1, as shown in the cross-sectional view of FIG. 13.

Figure 14:
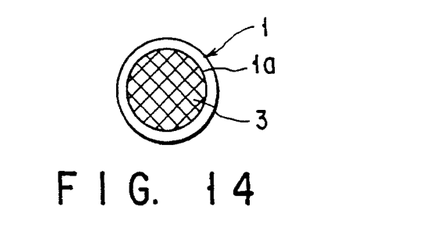
FIG. 14 shows the state in which a photoresist is not formed on the peripheral portion of the wafer by virtue of the mask member shown in FIGS. 11 and 12.

As a result, the photoresist 3 is not coated on the wafer peripheral portions 1a, as shown in FIG. 14, after the photoresist material 3 has been applied to the surfaces of the wafers 1. Accordingly, there is no need to provide a device for removing an unnecessary photoresist film from the wafer peripheral portions after application of the photoresist material. Therefore, the through-put of the process increases, the manufacturing cost decreases remarkably, and the practical demand in the wafer processing can be met.

With reference to FIGS. 15 to 24, a blade nozzle type organic material applying apparatus for applying a resist material to a semiconductor wafer will now be described, wherein a necessary amount of resist material can be discharged from the blade nozzle and efficiently used, and a smooth, uniform wafer surface can be obtained.

Figure 15:
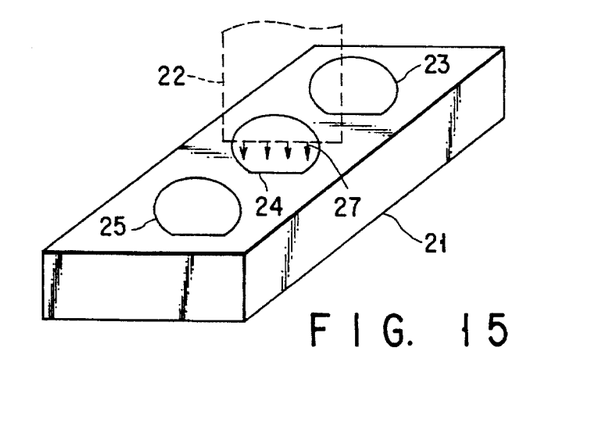
FIG. 15 is a schematic perspective view of a resist applying apparatus according to a blade nozzle method.

FIG. 15 is a perspective view showing a blade nozzle type resist applying apparatus. First to third wafer mounting portions (not shown) are provided on a coater body 21 having a baking treatment mechanism (not shown). The baking treatment mechanism includes, for example, a thermocouple. A movable blade nozzle 22 is situated above the coater body 21. A wafer container (not shown) is provided near the coater body 21, and a plurality of wafers are contained in the wafer container.

In the above structure, first to third wafers 23 to 25 are taken out of the wafer container by wafer conveying means (not shown) and mounted on the wafer mounting portions. Then, the blade nozzle 22 is moved to a location above the first wafer 23. While the nozzle 22 is moved over the wafers 23 to 25 like scanning, an organic material (not shown) such as a resist material is discharged from the nozzle 22 in the direction of arrow 27. At the same time, the wafers 23 to 25 are baked at temperatures of 80° C. to 100° C. by the baking treatment mechanism (not shown) situated under the wafers 23 to 25.

Specifically, the first to third wafers 23 to 25 are baked by the baking treatment mechanism and simultaneously the blade nozzle 22 moves over the wafers 23 to 25, as if it is scanning, and discharges the resist material. Thereby, the resist material is applied to the surfaces of the wafers 23 to 25.

Figure 16:
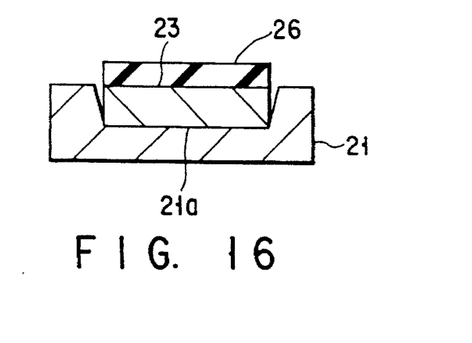
FIG. 16 is a cross-sectional view of the resist applying apparatus shown in FIG. 15 in the state in which a resist is coated on the surface of the wafer.

FIG. 16 is a cross-sectional view showing the state in which a resist has been formed on the surface of the wafer by the resist applying apparatus shown in FIG. 15. The wafer 23 is mounted on the wafer mounting portion 21a of the coater body 21, and the resist 26 is coated on the surface of the wafer 23.

Figure 17:
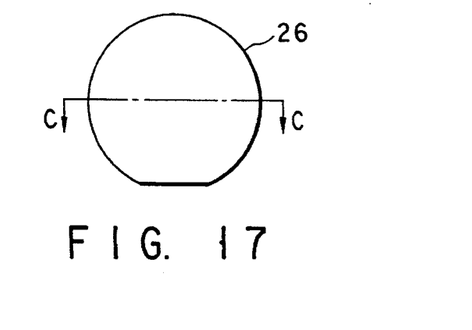
FIG. 17 is a plan view showing the surface of the wafer coated with the resist, as shown in FIG. 16, which is smooth and free of resist interference fringe.
Figure 18:
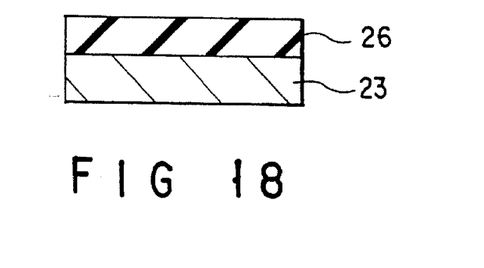
FIG. 18 is a cross-sectional view of the wafer coated with the resist shown in FIG. 17, taken along line C—C in FIG. 17.

FIG. 17 is a plan view showing the wafer which has been coated with the resist by means of the resist applying apparatus shown in FIG. 15, and FIG. 18 is a cross-sectional view taken along line C—C in FIG. 17.

Figure 19:
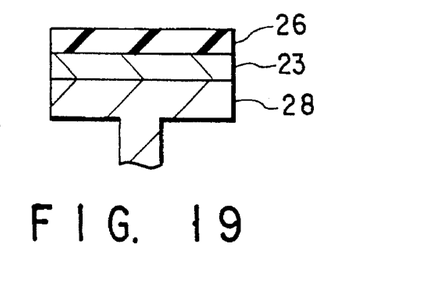
FIG. 19 is a cross-sectional view of the resist applying apparatus shown in FIG. 16, in which a wafer stage of the apparatus is modified.

FIG. 19 is a cross-sectional view showing a modification of the resist applying apparatus shown in FIG. 16, wherein the wafer stage for supporting the wafer in the resist applying apparatus shown in FIG. 16 is modified. The wafer 23 is fixed on the wafer stage 28 by vacuum suction, and the resist 26 is applied to the surface of the wafer 23.

According to the above embodiment, the coater body 21 is provided with the baking treatment mechanism and therefore the wafer can be subjected to baking treatment while the resist material 26 is applied to the wafer by the blade nozzle 22. Thus, the resist material 26 with some fluidity can be baked, and a solvent included in the resist material 26 can be evaporated uniformly. As a result, as shown in FIG. 17, no resist interference fringe appears on the surface of the resist 26 coated on the wafer 23. In other words, as shown in the cross-sectional view of FIG. 18, the resist 26 can be provided with a smooth, uniform surface.

Only a necessary amount of resist material 26 is discharged from the blade nozzle 22 and applied to the surfaces of the wafers 23 to 25. Thus, the amount of used resist material 26 can be reduced, and the efficiency of use of material can be enhanced.

In the above first embodiment, the resist material 26 is applied on the surfaces of the wafers 23 to 25 by means of the blade nozzle 22, but the material 26 may be applied to the surfaces of wafers 23 to 25 by means of a slit dispense nozzle.

The baking treatment mechanism is housed within the coater body 21, but the baking can be effected by ultraviolet rays, etc. In this case, the baking treatment mechanism must be able to bake the resist with some fluidity.

Figure 20:
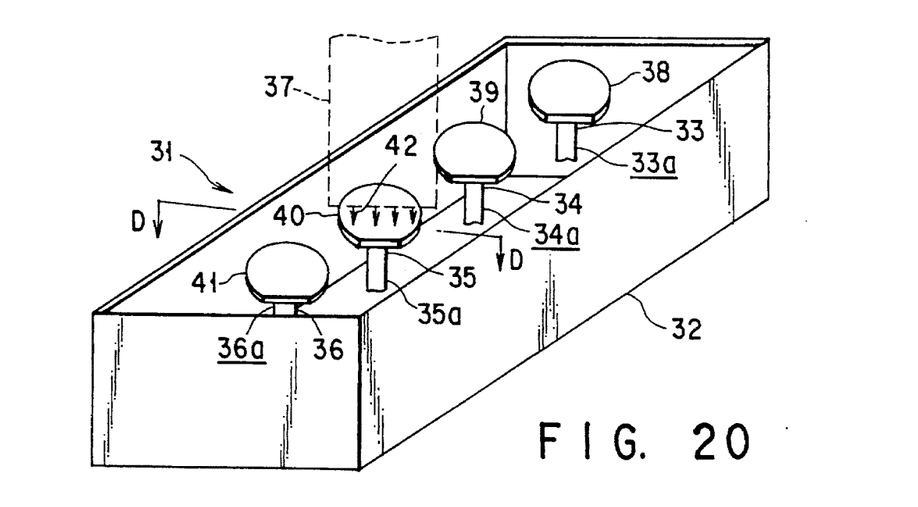
FIG. 20 is a schematic perspective view of another resist applying apparatus.
Figure 21:
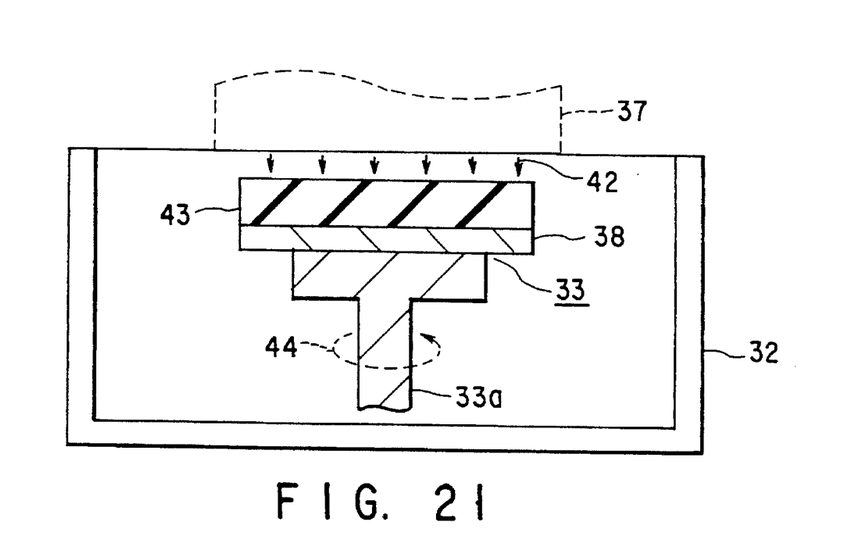
FIG. 21 is a cross-sectional view of the resist applying apparatus shown in FIG. 20, taken along line D—D.

FIG. 20 is a perspective view showing a resist applying apparatus according to another embodiment of the invention, and FIG. 21 is a cross-sectional view taken along D—D in FIG. 20. This resist applying apparatus comprises an application unit 31 and a baking unit (not shown). A coater body 32 of the application unit 31 includes first to fourth wafer stages 33 to 36 having first to fourth rotary shafts 33a to 36a. A movable blade nozzle 37 is situated above the coater body 32. The baking unit (not shown) is provided near the coater body 32. A wafer container (not shown) is provided near the coater body 32, and it contains a plurality of wafers.

In the above structure, first to fourth wafers 38 to 41 are taken out of the wafer container by wafer conveying means (not shown) and mounted on the first to fourth wafer stages 33 to 36. Then, the blade nozzle 37 is moved to a location above the first wafer 38, as shown in FIG. 21. While the nozzle 37 is moved over the wafers 38 to 41 like scanning, a resist material 43 is discharged from the nozzle 37 in the direction of first arrow 42. As a result, the resist material 43 is efficiency applied to the surfaces of the first to fourth wafers 38 to 41. The first to fourth rotary shafts 33a to 36a are rotated in the direction of second arrow 44 by a motor (not shown).

Subsequently, the first to fourth wafers 38 to 41 are conveyed to the baking unit by a conveyor belt (not shown), and the wafers 38 to 41 are baked by the baking unit.

As has been described above, after the resist material 43 is applied to the surfaces of the wafers 38 to 41 by the blade nozzle 37, the wafer stages 33 to 36 are rotated. Thereby, the uniform surface of the resist material 43 is realized, and part of the solvent included in the resist material 43 can be evaporated. In this way, the baking treatment is effected by the baking unit in the state in which the surface of the resist material 43 is made uniform and part of the solvent is evaporated. As a result, the resist 43 having the smooth, uniform surface free from resist interference fringe can be formed on the wafer 38, as shown in FIGS. 17 and 18.

Only a necessary amount of resist material 43 is discharged from the blade nozzle 37 and applied to the surfaces of the wafers 38 to 41. Thus, the amount of used resist material 43 can be reduced, and the efficiency of use of material can be enhanced.

In the above embodiment, the resist material 43 is applied on the surfaces of the wafers 38 to 41 by means of the blade nozzle 37, but the material 43 may be applied to the surfaces of wafers 38 to 41 by means of a slit dispense nozzle.

Figure 22:
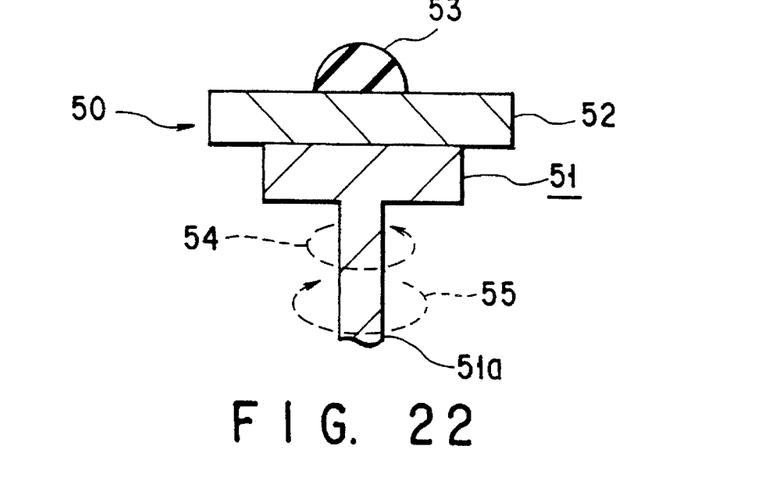
FIG. 22 is a cross-sectional view of an important portion of still another resist applying apparatus.

FIG. 22 is a cross-sectional view showing a part of a resist applying apparatus according to still another embodiment of the invention. This resist applying apparatus comprises an application unit 50 and a baking unit (not shown). In the application unit 50, a wafer 52 is fixed on a wafer stage 51 having a rotary shaft 51a. A drop of resist material 53 is applied to a center area of the surface of the wafer 52. Thereafter, the rotary shaft 51a is rotated by a motor (not shown) in the direction of first arrow 54 for a predetermined time period. Then, the direction of rotation of the rotary shaft 51a is reversed instantaneously, and the wafer 52 is rotated in the direction of second arrow 55 for a predetermined time period.

Specifically, the rotary shaft 51a is rotated alternately in the directions of first and second arrows 54 and 55. Thereby, the wafer 52 is rotated alternately in the directions of first and second arrows 54 and 55.

Figure 23:
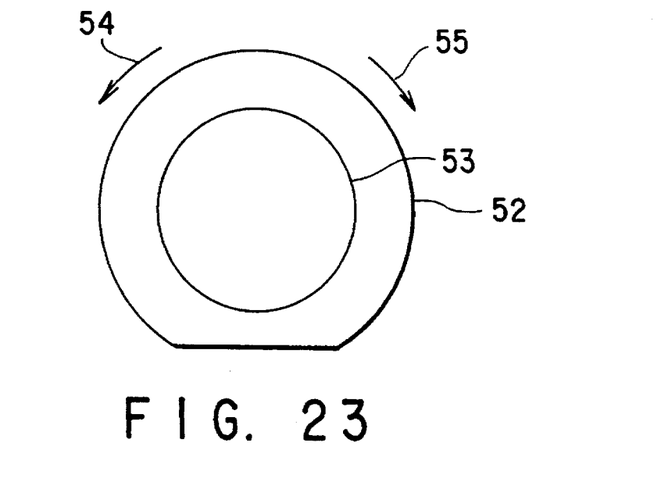
FIG. 23 is a plan view showing the state in which a resist material is spread over the wafer surface by the resist applying apparatus shown in FIG. 22.

FIG. 23 is a plan view showing the state in which the resist material is spread over the surface of the wafer by the resist applying apparatus shown in FIG. 22. Since the wafer 52 is rotated alternately in the directions of first and second arrows 54 and 55, the drop of the resist material 53 on the surface of the wafer 52 is spread from the center to the periphery.

Thereafter, the wafer 52 is conveyed to the baking unit by a conveyor belt (not shown), and the wafer 52 is baked by the baking unit.

Figure 24:
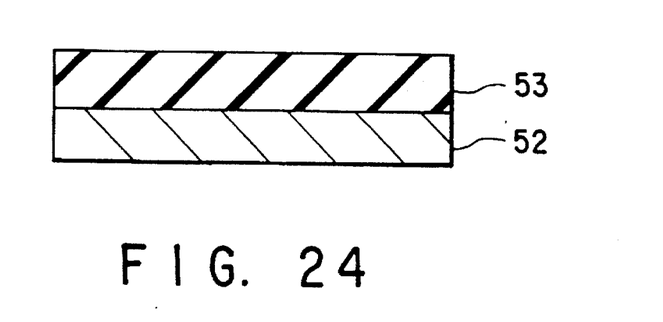
FIG. 24 is a cross-sectional view of the wafer over which the resist material has been applied by the resist applying apparatus shown in FIG. 22.

FIG. 24 is a cross-sectional view showing the wafer the surface of which has been coated with the resist material by the resist applying apparatus shown in FIG. 22.

According to this embodiment, the wafer 52 is fixed on the wafer stage 51, the drop of resist material 53 is applied to the surface of the wafer 52, and the rotary shaft 51a is rotated. Thereby, as shown in FIG. 23, the resist material 53 is spread over the wafer 52. In this case, the rotary shaft 51a is rotated such that the direction of rotation is instantaneously switched between the directions of first and second arrows 54 and 55. Therefore, the resist material 53 can be spread uniformly. As a result, as shown in FIG. 24, the surface of the resist material 53 applied onto the wafer 52 can be made very smooth and uniform.

Since the resist material 53 is spread by rotating the wafer alternately in the directions of first and second arrows 54 and 55, the efficiency of use of material can be enhanced, as compared to the conventional spin-coating method in which a wafer is rotated only in one direction.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An organic material applying apparatus comprising:

a movable organic material discharge nozzle having an organic material discharge port for discharging an organic material at a position facing a semiconductor wafer, said discharge port having an adjustable opening width;

means for detecting a period of time during which said discharge nozzle and the semiconductor wafer are moved relative to each other at a predetermined velocity, said detecting means being coupled to said discharge nozzle;

said period of time being measured from when the semiconductor wafer is at a predetermined position;

wafer width calculating means for calculating a width of that portion of the semiconductor wafer, which said discharge port of the moved nozzle faces, on the basis of the movement time detected by said detecting means; and nozzle discharge port opening width adjusting means coupled to said wafer width calculating means for adjusting the opening width of the discharge port of the nozzle in accordance with the wafer width calculated by said wafer width calculating means.

2. The apparatus according to claim 1, wherein said organic material discharge nozzle is a blade nozzle.

3. The apparatus according to claim 1, wherein said organic material discharge nozzle is a slit nozzle.

4. The apparatus according to claim 1, wherein said organic material is a photoresist material.

5. An organic material applying apparatus comprising:

a movable organic material discharge nozzle having an organic material discharge port for discharging an organic material at a position facing a semiconductor wafer, said discharge port having an adjustable opening width;

sensing means, provided near an end portion of said nozzle, for sensing the position of an edge of the semiconductor wafer; and nozzle discharge port opening width adjusting means coupled to said sensing means for adjusting the opening width of the discharge port of the nozzle in accordance with the position of the edge of the semiconductor wafer sensed by said sensing means.

6. The apparatus according to claim 5, wherein said organic material discharge nozzle is a blade nozzle.

7. The apparatus according to claim 5, wherein said organic material discharge nozzle is a slit nozzle.

8. The apparatus according to claim 5, wherein said organic material is a photoresist material.

9. An organic material applying apparatus comprising:

a movable organic material discharge nozzle having an organic material discharge port for discharging an organic material at a position facing a semiconductor wafer, said discharge port having an adjustable opening width;

means for detecting a period of time during which said discharge nozzle and the semiconductor wafer are moved relative to each other at a predetermined velocity, said detecting means being coupled to said discharge nozzle;

said period of time being measured from when the semiconductor wafer is at a predetermined position;

wafer width calculating means for calculating a width of that portion of the semiconductor wafer, which said discharge port of the moved nozzle faces, on the basis of the movement time detected by said detecting means;

nozzle discharge port opening width adjusting means coupled to said wafer width calculating means for adjusting the opening width of the discharge port of the nozzle in accordance with the wafer width calculated by said wafer width calculating means; and a mask member, interposed between said nozzle and the semiconductor wafer, for masking a peripheral portion of the wafer and preventing application of the organic material onto the peripheral portion of the wafer.

10. The apparatus according to claim 9, wherein said organic material discharge nozzle is a blade nozzle.

11. The apparatus according to claim 9, wherein said organic material discharge nozzle is a slit nozzle.

12. The apparatus according to claim 9, wherein said organic material is a photoresist material.

13. An organic material applying apparatus comprising:

a movable organic material discharge nozzle having an organic material discharge port for discharging an organic material at a position facing a semiconductor wafer, said discharge port having an adjustable opening width;

sensing means, provided near an end portion of said nozzle, for sensing the position of a peripheral portion of the semiconductor wafer;

nozzle discharge port opening width adjusting means coupled to said sensing means for adjusting the opening width of the discharge port of the nozzle in accordance with the position of the peripheral portion of the semiconductor wafer sensed by said sensing means; and a mask member, interposed between said nozzle and the semiconductor wafer, for masking the peripheral portion of the wafer;

said sensing means sensing the peripheral portion of said semiconductor wafer when said sensing means senses said mask member; and said adjusting means adjusting said opening width of said discharge port, when the peripheral portion is sensed, to prevent the discharge of the organic material from said nozzle onto the periperial portion.

14. The apparatus according to claim 13, wherein said organic material discharge nozzle is a blade nozzle.

15. The apparatus according to claim 13, wherein said organic material discharge nozzle is a slit nozzle.

16. The apparatus according to claim 13, wherein said organic material is a photoresist material.

* * * * *